United States Patent [19]

Giamei et al.

[11] Patent Number: 4,514,360
[45] Date of Patent: Apr. 30, 1985

[54] WROUGHT SINGLE CRYSTAL NICKEL BASE SUPERALLOY

[75] Inventors: Anthony F. Giamei, Middletown, Conn.; Bernard H. Kear, Whitehouse Station, N.J.

[73] Assignee: United Technologies Corporation, Hartford, Conn.

[21] Appl. No.: 447,067

[22] Filed: Dec. 6, 1982

[51] Int. Cl.³ .......................... C22C 19/05; C21D 8/00
[52] U.S. Cl. ................................ 420/454; 148/11.5 N; 148/410
[58] Field of Search ............... 148/2, 11.5 N, 12.7 N, 148/404, 410, 131, 162; 420/448, 454

[56] References Cited

U.S. PATENT DOCUMENTS

| | | | |
|---|---|---|---|
| 3,147,155 | 9/1964 | Lamb | 148/11.5 |
| 3,413,204 | 11/1968 | Rexer et al. | 204/140.5 |
| 3,420,716 | 1/1969 | Slepitis | 148/11.5 |
| 3,642,543 | 2/1972 | Owczarski et al. | 148/12.7 |
| 3,676,225 | 7/1972 | Owczarski et al. | 148/12.7 |
| 3,677,830 | 7/1972 | Cox et al. | 148/12.7 |
| 3,975,219 | 8/1976 | Allen et al. | 148/11.5 |
| 4,033,792 | 5/1977 | Giamei et al. | 148/32 |
| 4,116,723 | 9/1978 | Gell et al. | 148/3 |
| 4,209,348 | 6/1980 | Duhl et al. | 148/3 |
| 4,222,794 | 9/1980 | Schweizer et al. | 148/162 |
| 4,328,045 | 5/1982 | Pearson et al. | 148/162 |
| 4,371,404 | 2/1983 | Duhl et al. | 148/162 |
| 4,385,939 | 5/1983 | Kortovich, Jr. et al. | 148/12.7 N |
| 4,392,894 | 7/1983 | Pearson et al. | 148/2 |

FOREIGN PATENT DOCUMENTS 0052911  6/1982  European Pat. Off. ............ 148/404

OTHER PUBLICATIONS

Tien et al. I, "Effects of Stress Coarsening on Coherent Particle Strengthening", Metallurgical Transanctions, vol. 3, Aug. 1972, pp. 2157–2162.
Tien et al. II, "The Effect of Orientation and Sense of Applied Uniaxial Stress on the Morphology of Coherent Gamma Prime Precipitates in Stress Annealed Nickel-Base Superalloy Crystals", Metallurgical Transactions, vol. 2, Feb. 1971, pp. 543–553.
Tien et al. III, "The Effect of Uniaxial Stress on the Periodic Morphology of Coherent Gamma Prime Precipitates in Nickel–Base Superalloy Crystals", Metallargical Transactions, vol. 2, Jan. 1971, pp. 215–219.

Primary Examiner—L. Dewayne Rutledge
Assistant Examiner—Robert L. McDowell
Attorney, Agent, or Firm—C. G. Nessler

[57] ABSTRACT

Single crystal nickel base superalloys of the gamma-gamma prime type are strengthened by deforming them 2–14% at temperatures in the range 700°–1100° C. Yield strength will be increased typically by 25–50%, depending on the crystallographic orientation. Careful control of parameters is necessary to obtain the strengthening while avoiding recrystallization. The metal is first homogenized and provided with a fine gamma prime deformation; strain rates in the range of $10^{-1}$ cm/cm/sec or less are used.

10 Claims, 7 Drawing Figures

WROUGHT SINGLE CRYSTAL NICKEL BASE SUPERALLOY

TECHNICAL FIELD

The present invention relates to the hot forming of cast metals, most particularly to the strengthening of single crystal nickel superalloys by forming at an elevated temperature.

BACKGROUND ART

U.S. Pat. Nos. 3,494,709 and 3,536,121 to Piearcey disclose the basic utility and method of making single crystal superalloy gas turbine blades. Since the early 1970's date of the patents, there has been considerable research and development applied to single crystal turbine blades, to the point where they are presently in use in both military gas turbine aircraft engines and in commercial aviation. The especially attractive feature of single crystal gas turbine blades is their high temperature creep strength. Since single crystal superalloys retain their strength to higher temperatures than polycrystalline counterparts, there is less need for cooling air and higher engine efficiencies result.

The single crystal approach has extended the upper temperature capability of nickel superalloys into the range 1000°–1200° C. The thrust of single crystal alloy and heat treatment development has been to further improve the high temperature utility of this class of material. See U.S. Pat. No. 4,209,348 to Duhl et al and U.S. Pat. No. 4,222,794 to Schweizer et al. Typically, single crystal turbine articles are hollow; they are cast to nominal size and machined at some locations. All the foregoing patents are of the present assignee and their disclosures are hereby incorporated by reference.

Nickel superalloys in general, including single crystal alloys, owe their excellent high temperature properties to the presence of the coherent ordered precipitate gamma prime. Since the days of the early superalloys, it has been an aim to increase the volume fraction of gamma prime. However, in achieving this objective, the resultant alloys have become less forgeable. For example, an early alloy such as Waspaloy was easily worked above the gamma prime solvus temperature. More recent intermediate strength alloys such as Astroloy are worked with difficulty below the gamma prime solvus: low strain rates must be used to avoid grain boundary cracking. And since the temperature of the billet is critical, warm die forging is generally used; intermediate annealing steps are prevalent. The highest strength superalloys with very high volume fractions of gamma prime, such as IN-100 and MAR M-200, generally are considered unworkable. On occasion, they can be cast as ingots, heat treated and successfully worked. However, the results tend to be unreproducible from billet to billet. This is due at least in part to macrosegregation, i.e., substantial variations in the local concentration of titanium or aluminum which result in local differences in the amount of eutectic gamma prime. This makes for a varied localized response to heat treatment. In addition, there often is residual microsegregation which can lead to incipient melting and cracking at relatively low temperatures. Cast single crystal alloys do not exhibit macrosegregation but they tend to be characterized by high volume fractions of gamma prime and some microsegregation.

Thermal mechanical working has been applied to gamma prime containing superalloys as exemplified by U.S. Pat. No. 3,147,155 to Lamb. His procedure for working a polycrystalline nickel chromium alloy involves solutioning the alloy to dissolve the gamma prime phase, cooling it to a temperature at which the gamma prime phase precipitates (but not the carbide phase) and then hot working it. Various patents of the present assignee are also informative. U.S. Pat. No. 3,676,225 to Owczarski et al describes how superalloys characterized by lower gamma prime volume fractions are strengthened by a procedure which includes solutioning, rapid cooling, cold working, aging, and warm working. In the procedure, applicable to alloys such as IN-718 and IN-901, the alloy is made workable by the rapid cooling step which avoids the formation of a precipitate. U.S. Pat. No. 3,975,219 to Allen et al discloses how high gamma prime content superalloys are deformed at constant temperature under critical conditions of strain rate, total strain, and temperature to produce a particular uniform dislocation density. A steep thermal gradient is then caused to pass through the workpiece to cause recrystallization of a progressive nature. U.S. Pat. No. 3,677,830 to Cox et al describes how precipitation hardening nickel base superalloys are heat treated, first at a temperature below the gamma prime solvus, and second, at a temperature equal to or just slightly below the gamma prime solvus. By these processes, there is obtained a uniform gamma prime precipitate pattern and controllable grain size, the grain size being inhibited by the formation of the gamma prime.

U.S. Pat. No. 3,642,543 to Owczarski and Oblak discloses a process for a thermal mechanical processing of alloys having gamma prime content in the range of 25%. The process involves solutioning followed by aging to create a finely spaced gamma prime structure with the spacing on the order of five microns or less; the material is then rolled at elevated temperature to deform it by at least 15%; thereafter the material is heat treated for stabilization of the substructure and additional precipitation hardening. It is indicated in the patent how single crystals of the alloys Udimet 700 and MAR M-200 were thermal mechanically worked to reductions of about 42%, with the result that yield strengths were increased by about 25%. Of course, rolling is a process characterized by high strain rates and variation in temperature of the workpiece during the time it is being worked. In the process of U.S. Pat. No. 3,642,543 a multiplicity of passes are used, each with 5–10% reduction and followed by re-heating of the workpiece.

The present day cast single crystal superalloys are in many ways simpler alloys than the older polycrystalline materials referred to in the paragraphs above. This is so because they are lacking the grain boundary strengtheners which are absolutely necessary for high temperature performance of polycrystalline materials. But this absence creates a limitation in that working of the material can readily produce recrystallization when the article is subsequently exposed to high temperature during processing or use. Once a high angle grain boundary forms in a single crystal, it becomes a point of substantial weakness. When used at an elevated temperature, a recrystallized single crystal material will tend to fail at the recrystallized grain boundary since there are no ingredients present in the alloy to inhibit movement along the grain boundary. Thus, in the practical manufacture of single crystal nickel superalloys, thermal mechanical working has not been considered an option.

It appears that the rolling process of U.S. Pat. No. 3,642,543 would incur a great chance of recrystallization during rolling, owing to the stated variation in bulk temperature, and the likelihood of cooling at edges, etc. But as reference to the patent will show, the early single crystal alloys contained carbon, boron, and zirconium and thus still had within them the ingredients which aid in grain boundary strengthening and also act to inhibit growth of recrystallized grains.

Generally, single crystal alloys and parts have been designed to withstand the highest use temperatures; but, they have had adequate properties at the intermediate temperatures to which they are subjected. Nonetheless, there is a constant search for improvements in properties in superalloys, and for materials which have very high yield and fatigue strengths at intermediate temperatures of gas turbine engine use.

DISCLOSURE OF THE INVENTION

An object of the invention is to improve the intermediate temperature properties of advanced single crystal nickel superalloys.

According to the invention, a nickel base superalloy having both an incipient melting point temperature and a gamma prime solvus temperature which are greater than 1250° C. can have its intermediate temperature yield strength increased by 25-50% by deforming it a relatively small amount, such as 2-15%, at elevated temperature in the 700°-1100° C. range. Substantial strengthening of single crystals has been found to be obtainable provided the temperature of deformation is critically controlled. In the invention, isothermal deformation at controlled strain rates induces a dislocation substructure which is preserved during use at intermediate temperatures.

To obtain the best results in nickel superalloys a single crystal casting must be first homogenized to eliminate microsegregation by heating at an elevated temperature at or above the gamma prime solvus. Rapid cooling or other heat treatment is then utilized to create a fine gamma prime precipitate. Homogenization is needed to obtain uniformity and maximization of strengthening. The fine precipitate is needed to inhibit the motion of dislocations induced during deformation, to thereby maximize strengthening.

The deformation temperature is preferably in the vicinity of 900°-1000° C. and the amount of deformation is preferably about 5-10%. Greater deformations can be used but do not appear to provide significant benefit. In an exemplary single crystal alloy called Alloy 1444, it is seen that the increment of property improvement tends to decrease substantially as the amount of deformation approaches 15%. The strain rate is critical; it must be less than about $10^{-1}$ and more than about $10^{-4}$ cm/cm/sec. If too low a strain rate is used then the desired strengthening will not be induced; if it is too great then the material will crack.

Use of the invention on advanced single crystal alloys has indicated that 0.2% yield strength at 20°-600° C. will be increased by at least 15%. Based on prior experience, the high frequency fatigue strength is also increased in a substantial amount. The low degree of deformation now found useful means that it is feasible to make precision parts such as hollow air cooled turbine blades. The use of isothermal forging means that precision dimensions can be achieved in the deformed article.

The foregoing and other objects, features and advantages of the present invention will become more apparent from the following description of preferred embodiments and accompanying drawings.

BEST MODE FOR CARRYING OUT THE INVENTION

The invention is described in terms of the alloy referred to as Alloy 1444 (by weight percent 5Al, 2Ti, 9Cr, 12W, balance Ni). This is the same alloy which is referred to in certain other U.S. patents, such as No. 4,116,723 of the present assignee as Alloy 444. The invention will also be useful with other like single crystal alloys such as those described in U.S. Pat. Nos. 4,116,723, 4,209,348 and 4,222,794, the disclosures of which are hereby incorporated by this reference. The composition of the subject alloy of U.S. Pat. No. 4,222,794 is by weight percent 4.6-6Cr, 5-5.8Al, 0.8-1.5ti, 1.7-2.3Mo, 4-6W, 5.5-8Ta, 1-5Re, 0.2-0.6V, 0-7Co, balance Ni. Generally, the invention will utilize single crystal type nickel base superalloys having 30-70 volume percent gamma prime. It is most pertinent to alloys having high volume percents gamma prime, in the range of 40-70%.

Figure 1:
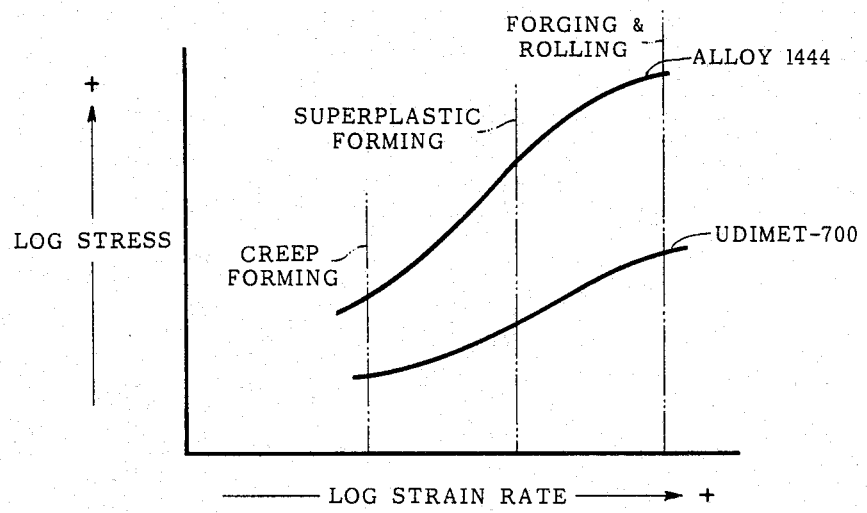
FIG. 1 shows how flow stress varies as a function of strain rate for an alloy of the prior art (Udimet-700) and one of the present invention (Alloy 1444).

The alloys to which the present invention is pertinent are to be distinguished from certain other alloys, such as Udimet 700 and MAR M-200 which were thermal mechanically worked in the prior art. FIG. 1 indicates how the flow stress necessary to form an article at a constant temperature varies according to the strain rate which is induced and the composition of the material. Referring to the Figure which is conceptual in nature, it is seen that the flow stress of Udimet 700 rises with the strain rate. This is also true for Alloy 1444, but the stress necessary to move Alloy 1444 is substantially greater. This is due to the higher volume fraction of gamma prime in the stronger and more modern Alloy 1444. The significance of the Figure is that the Alloy Udimet 700 can be forged and rolled at temperatures in the 700°-1100° C. range. However, in the same temperature range, flow stresses for Alloy 1444 are exceedingly high. This means that high strain rate processes such as common forging and rolling will either cause cracking of the material or require unfeasibly high forces, for any but the smallest articles.

A distinction that can be made between MAR M-200 and alloys such as Alloy 1444 is the effect of solution heat treatment on the naturally occurring interdendritic microsegregation which occurs in cast alloys. The conventional solution heat treatment time of four hours, well known for superalloys in general, will substantially reduce the segregation of Udimet 700. On the other hand, tests have shown that the microsegregation in the alloy MAR M-200 is not substantially reduced in four hours during the same processing at its maximum temperature. The maximum allowable temperature to which alloys such as Udimet 700 or MAR M-200 may be subjected while preserving properties is determined by the temperature at which incipient melting occurs. Because alloys such as Alloy 1444 have substantially higher incipient melting points than those which contain grain boundary strengtheners, they can be more feasibly heat treated to achieve homogenization. Compared to alloys to which thermal mechanical working was applied in the past, the present alloys will have incipient melting points of no less than about 1250° C., and will be free of significant amounts of boron, zirconium and hafnium. Usually, they will also be substantially free of carbon, but on occasion there may be some carbon, up to the range of 0.03 percent.

In the invention it is important that the single crystal alloy first be heat treated at a temperature and time sufficient to reduce the compositional variation to 30% or less of that which was present in the as-cast alloy. The change in compositional variation is a relative measurement ascertainable by considering a totally homogenized alloy (one heated at just below the incipient melting temperature for several hundreds of hours) as representing 0% and the as-cast alloy as representing 100%. Microsegregation is generally measured by determining the variation in aluminum and refractory metal (Mo, W, Ta, Re, etc.) contents by means of an electron microprobe. Homogenization is necessary to obtain uniform composition and uniform response to deformation.

As an example of the present invention, the Alloy 1444 was made as a cast single crystal bar using the now well known techniques, as initially taught by Piearcey in U.S. Pat. Nos. 3,494,709 and 3,536,121, the disclosures of which are hereby incorporated by reference. Rectanguloid 5×5×15 mm specimens were cut from the casting and were subjected to a heat treatment sequence of 1290° C./4 hr/AC+1080° C./4 hr/AC+870° C./32 hr/AC (where AC indicates air cooling). The last two heat treatments are characteristic of those to which an Alloy 1444 turbine blade is subjected during coating and final aging but they are not necessary in the practice of the invention. The specimens had selected longitudinal axis crystal orientations of [001], [011] and [111] and were subjected to different combinations of thermal mechanical working. The strain was applied compressively along the 15 mm axis and varied between 5 and 20% while the temperature was ranged between 1190° C. and 890° C. Table 1 indicates the results of compressive straining of 10% applied at different temperatures on compressive yield strength. (Tensile yield strength is closely related to the compressive measurement in gamma-gamma prime superalloys.) It is seen that minimal or inconsistent effect is obtained at temperatures of 1090° and 1190° C. while substantial consistent improvement is obtained at 990° and 880° C.

Figure 2A:
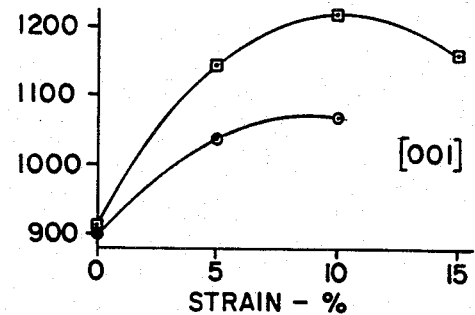
FIGS. 2a-c show how yield strength of Alloy 1444 improves as a function of the temperature and percent deformation.
Figure 2B:
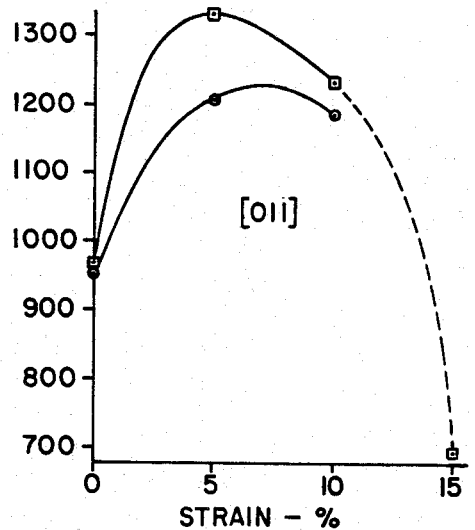
Figure 2C:
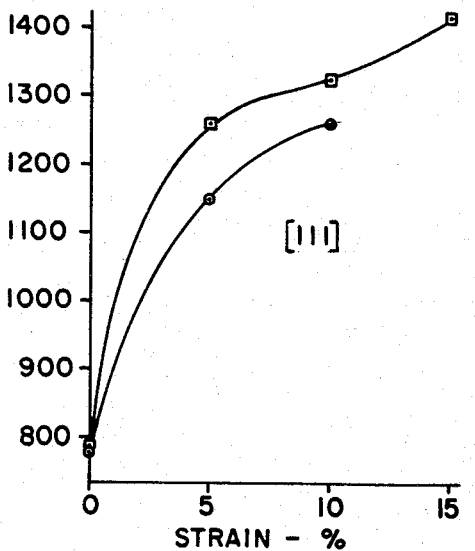

Table 2 shows the data for the 890° and 990° C. temperatures of deformation, according to the crystallographic axis which characterized the specimen principal axis. It is seen that for all orientations there is a substantial change at 595° C. in 0.2% yield strength. Similar changes were obtained at 20° C. The data from Table 2 are plotted in FIG. 2. Compared to the baseline initial strength (which is reproducible to less than 2% variation) it can be seen that there is a substantial increase in strength over the range of deformation. Of particular interest is the [001] orientation because this is the orientation that usually lies along the principal stress axis in high temperature creep and thermal fatigue resisting components. For the [111] axis there is a suggestion of leveling of effect in the range 10-15%. For the [011] axis, there is a suggestion that the peak effect is obtained at 5% strain. Generally, it is seen that the 890° C. temperature of deformation tends to give better properties than does 990° C.

TABLE 1

Effect of Working Temperature on 0.2% Yield Strength of Alloy 1444 Single Crystal Which is Deformed 10%

| Specimen Orientation | Initial Strength (a) MPa | Deformation Temperature °C. | Worked Strength MPa |
|---|---|---|---|
| Yield Strength Measured at 700° C. | | | |
| [001] | 945 | 1190 | 944 |
| [111] | 901 | 1190 | 1126 |
| [001] | 942 | 1090 | 924 |
| [011] | 1042 | 1090 | (b) |
| Yield Strength Measured at 595° C. | | | |
| [001] | 907 | 990 | 1066 |
| [111] | 775 | 990 | 1257 |
| [001] | 938 | 890 | 1221 |
| [001] | 772 | 890 | 1324 |

(a) Initial Condition--As Cast + 1288° C./4 hr/AC + 1080° C./4 hr/AC + 870° C./32 hr/AC
(b) No data, defective specimen

TABLE 2

Effect of Working on 0.2% Yield Strength at 595° C. for Alloy 1444 Single Crystal

| Specimen Orientation | Initial Strength (a) MPa | Deformation Cycle % Strain/Temp (°C.) | Worked Strength MPa | Change % |
|---|---|---|---|---|
| [001] | 906 | 5/990 | 1036 | 15 |
| | 907 | 10/990 | 1066 | 18 |
| | 907 | 5/890 | 1144 | 26 |
| | 938 | 10/890 | 1221 | 30 |
| | 909 | 15/890 | 1160 | 28 |
| [011] | 961 | 5/990 | 1206 | 25 |
| | 950 | 10/990 | 1185 | 25 |
| | 972 | 5/890 | 1333 | 37 |
| | 940 | 10/890 | 1235 | 31 |
| | 994 | 13/890 | 697 (b) | — |
| [111] | 792 | 5/990 | 1151 | 45 |
| | 775 | 10/990 | 1257 | 62 |
| | 799 | 5/890 | 1258 | 57 |
| | 772 | 10/890 | 1324 | 72 |
| | 786 | 15/890 | 1417 | 80 |

(a) Initial Condition--As Cast + 1288° C./4 hr/AC + 1080° C./4 hr/AC + 870° C./32 hr/AC
(b) Specimen buckled Taken with the data for the temperatures above 990° C., it is seen that lower temperatures, in the vicinity of 900° C. are preferred. Based on extrapolation from the discovery reported herein, temperatures down to 700° C. may be used. Below this temperature there is undue rise in loading necessary to obtain deformation and cracking becomes likely. It is also seen that the preferred strain is in the range of 5-10%. However, overall the strength of the material is better around 15% than it is in the absence of the deformation cycle.

It is seen that the yield strength of Alloy 1444 is increased between 15-80%, according to the orientation and deformation cycle. Based on related experience, the yield strength increase can be expected to be accompanied by a mechanical (high frequency) fatigue improvement. The dislocation structure which results in the improvement for this typical nickel superalloy is calcuable as falling in the range up to $10^{12}$ cm/cm$^3$, more probably up to $10^{11}$ cm/cm$^3$. This is compared to a cast alloy having a dislocation density of up to $10^7$ cm/cm$^3$.

Figure 3A:
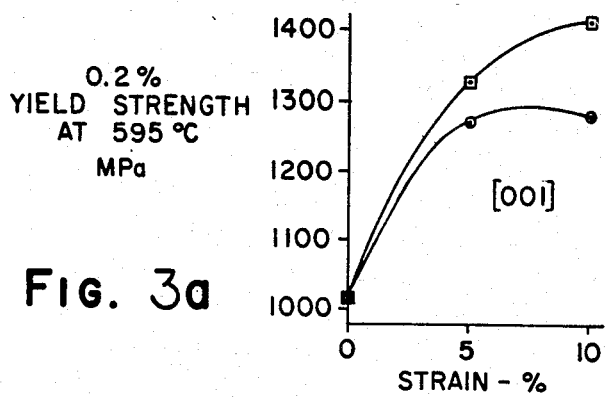
FIGS. 3a-c are similar to FIGS. 2a-c and show data the alloy PWA 1480.
Figure 3B:
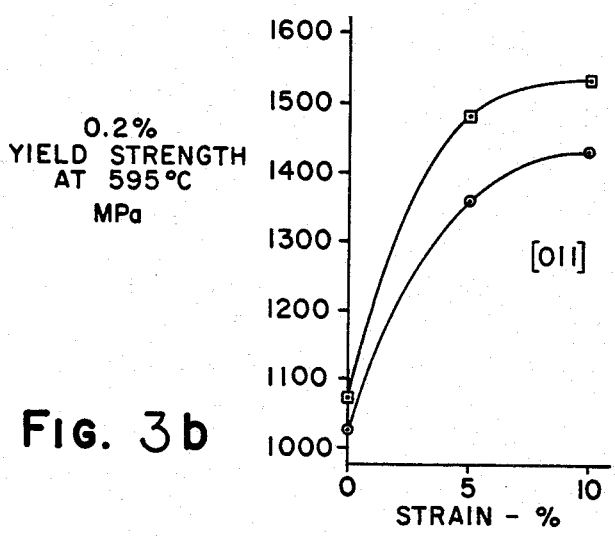
Figure 3C:
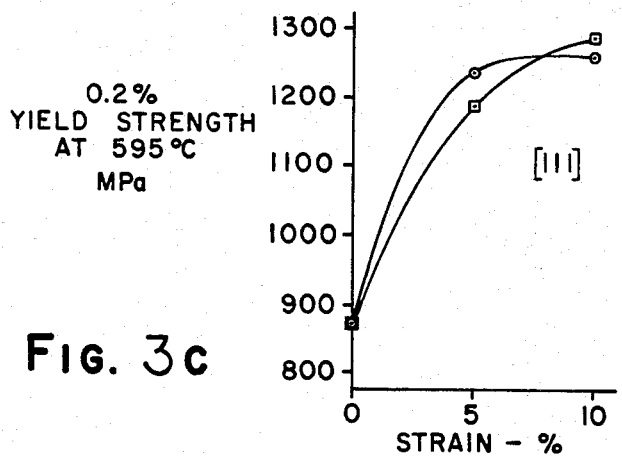

FIGS. 3a-c show that strengthening that occurs in the stronger single crystal alloy known as PWA 1480 (Pratt & Whitney Aircraft, East Hartford, Conn.), comprised by weight percent of 10Cr, 5Co, 4W, 1.5Ti, 12Ta, 5Al, balance nickel, and described in U.S. Pat. No. 4,209,348 to Duhl et al. The data is analogous to the data shown in FIGS. 2a–c. Again it is seen that greatest increment in strength occurs due to the initial 5 percent deformation, and there is a lesser increment of improvement when deformation is increased from 5 to 10 percent. Based on these data a small amount of straining, of the order of 2%, will provide a significant improvement. Straining of greater than about 15% may be used but there is no indication of any benefit and a suggestion that less than the maximum improvement may occur.

Prior to the deformation step, the alloy is air cooled from the solution temperature; this typically causes the creation of a fine gamma prime precipitate of at least 40 volume percent. By a fine precipitate is meant a uniformly distributed precipitate with an interparticle spacing no more than about $3 \times 10^{-6}$ meters. See U.S. Pat. No. 3,642,543 to Owczarski et al, the disclosure of which is incorporated by reference. The fine precipitate is needed to inhibit the motion of dislocations which are induced in the alloy by deformation.

The fine precipitate usually will be obtained by rapid cooling from above the solvus temperature; this may be obtained upon cooling from the homogenization step or in a subsequent re-heating; other options are possible. During deformation, the temperature and time of processing are chosen so that the fineness of the gamma prime is substantially preserved. After deformation is completed, intentional coarsening of the gamma prime by aging and so forth may optionally be undertaken to achieve other objects, but this is not expected to be common.

The material is next deformed by at least 2% and preferably less than 15%. The step of deforming the material is critical in several respects; including the temperature, the degree of deformation and the rate of deformation. The temperature must be below that (about 1200° C.) which would cause rapid coarsening of the gamma prime, but greater than 700° C. To obtain uniform results the material must be deformed at a constant temperature. Therefore, ceramic or refractory metal dies are used; they are heated to a temperature which is equal to the processing temperature of the metal. For Alloy 1444, the temperature of deformation must be less than 1100° C. and greater than 700° C.; preferably it is between about 900°–1000° C. i.e., about 250°–350° C. less than a gamma prime solvus temperature of about 1250° C. At temperatures beyond the maximum, there will be a continuous annealing and the requisite dislocations will not be created; at temperatures lower than the minimum undue force will have to be applied to the material to cause deformation and the malleability of the material will be such that cracking will be likely.

In the present invention the amount of deformation is critical. To obtain some strengthening it is necessary to obtain some deformation. However, it is surprising how little deformation is necessary to obtain strengthening, in view of the practices of the prior art. In the invention, deformation may range from 2–20%, preferably 5–14%. It is desirable that the material be deformed by applying compressive stresses, much as are applied when converting a billet into a pancake. However, the precise mode or direction of deformation is optional, and tensile straining may even be used. Whether a particular deformation is sufficient and within the scope of the invention is determinable by measuring the strength increase or dislocation density.

By deformation is meant herein that there is a plastic straining of the metal, to create the desired dislocation substructure. In the simple example given above to illustrate the preferred practice of the invention, the height of a small specimen was changed and the percent deformation was the percent change in height. Of course, this corresponded with the change (increase) in cross sectional area in the plane transverse to the height dimension. For material such as sheet or bar which is rolled or swaged, deformation would be a measure of the change in cross sectional area transverse to the rolling or swaging direction. In certain applications the material may be strained first in one direction and then in another opposing direction, so that the final dimension of the part is not changed in an amount that directly corresponds with the total plastic straining which was caused. Generally, deformation percent will be ascertainable by measuring the induced change in dislocation substructure and correlating that change with the change in a simple specimen where deformation is easily measured.

The rate of deformation is important to obtain satisfactory results because of the various considerations mentioned above. The strain rate must be between $10^{-4}$ and $10^{-1}$ cm/cm/sec. These strain rates are similar to those which characterize conventional superplastic forming of polycrystalline materials in the process known commercially as Gatorizing ® of Pratt & Whitney Aircraft. See Pat. No. 3,519,503 of the present assignee. The strain rate must be sufficient to induce dislocations in the material but insufficient to cause fracture of the material or the dies which are utilized to apply the force. (The present invention is quite distinct from Gatorizing in that there is no prerequisite grain size or superplastic phenomenon.)

Preferably, the present invention will be practiced generally using open or closed die forging, where parts are squeezed steadily between heated dies. However, any means of deformation can be used to carry out the objects of the invention, including swaging, rolling, and so forth, provided the parameters set forth herein are achieved.

Although this invention has been shown and described with respect to a preferred embodiment, it will be understood by those skilled in the art that various changes in form and detail thereof may be made without departing from the spirit and scope of the claimed invention.

We claim:

1. The method of strengthening a single crystal nickel base superalloy of the gamma-gamma prime type, the alloy having an incipient melting point temperature and a gamma prime solvus temperature both greater than 1250° C., which comprises heating the superalloy to a first temperature above the gamma prime solvus of the superalloy for a time sufficient to homogenize the alloy, cooling the alloy to form more than 40 volume percent fine gamma prime precipitate, heating the alloy to a second temperature between 700°–1100° C., said second temperature lower than that which coarsens the gamma prime, and deforming the alloy by 2–15% at a constant second temperature and a strain rate of less than $10^{-1}$ second$^{-1}$ to thereby introduce a dislocation substructure and raise the 0.2% yield strength of the superalloy without altering its single crystal structure.

2. The method of claim 1 which is characterized by deforming the superalloy 5-10%.

3. The method of claim 1 characterized by heating the superalloy at a temperature above the gamma prime solvus prior to the deformation process, to reduce microsegregation to less than 30 percent of that present in an as-cast single crystal.

4. The method of claim 1 characterized by a second temperature of between about 900°-1000° C.

5. The method of claim 1 characterized by a strain rate of $10^{-1}$ to $10^{-4}$ cm/cm/sec.

6. The method of claim 1 characterized by deforming the alloy at a temperature in the range 250°-350° C. below the gamma prime solvus.

7. The method of claim 1 wherein the yield strength of the superalloy is raised to at least 1000 MPa.

8. A single crystal nickel base superalloy of the gamma-gamma prime type having a composition substantially free of boron, hafnium and zirconium, less than 0.03 carbon, and 40-70 volume percent gamma prime, produced by deforming the alloy 2-15% at a strain rate of $10^{-1}$ to $10^{-4}$ second$^{-1}$ in the temperature range 700°-1100° C., said superalloy having a yield strength at least 15 percent greater than the same composition and heat treatment superalloy which has not been deformed, and the superalloy having a tensile yield strength in the crystal [001] direction of at least about 1000 MPa at 595° C.

9. The alloy of claim 8 having a tensile strength in the [001] crystal direction of at least about 1200 MPa at 595° C.

10. The alloy of claim 8 consisting essentially by weight percent of 4.5-6Cr, 5-5.8Al, 0.8-1.5Ti, 1.7-2.3Mo, 4-6W, 5.5-8Ta, 1-5Re, 0.2-0.6V, 0-7Co, balance Ni.

* * * * *